(12) United States Patent
Lenive et al.

(10) Patent No.: US 8,791,543 B2
(45) Date of Patent: Jul. 29, 2014

(54) COMPOSITE RECONSTITUTED WAFER STRUCTURES

(71) Applicant: Cambridge Silicon Radio Limited, Cambridge (GB)

(72) Inventors: Vlad Lenive, Sawston (GB); Simon Stacey, Ely (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/631,855

(22) Filed: Sep. 28, 2012

(65) Prior Publication Data

US 2014/0084391 A1    Mar. 27, 2014

(30) Foreign Application Priority Data

Sep. 25, 2012  (GB) .................................. 1217033.8

(51) Int. Cl.
*H01L 29/00*         (2006.01)
(52) U.S. Cl.
USPC ........................... 257/528; 257/414; 257/532

(58) Field of Classification Search
USPC .......................................... 257/414, 528, 532
See application file for complete search history.

(56) References Cited

U.S. PATENT DOCUMENTS

| | | | |
|---|---|---|---|
| 7,986,023 B2 * | 7/2011 | Tews et al. .................... | 257/528 |
| 2008/0029886 A1 | 2/2008 | Cotte et al. | |
| 2008/0315375 A1 | 12/2008 | Eichelberger et al. | |
| 2009/0072388 A1 | 3/2009 | Tews et al. | |
| 2009/0289345 A1 | 11/2009 | Tsai et al. | |
| 2010/0001396 A1 | 1/2010 | Meyer et al. | |
| 2011/0042781 A1 | 2/2011 | Liu | |

* cited by examiner

*Primary Examiner* — David Vu
*Assistant Examiner* — Brandon Fox
(74) *Attorney, Agent, or Firm* — Pillsbury Winthrop Shaw Pittman LLP

(57) ABSTRACT

A reconstituted electronic device comprising at least one die and at least one passive component. A functional material is incorporated in the substrate of the device to modify the electrical behavior of the passive component. The passive component may be formed in redistribution layers of the device. Composite functional materials may be used in the substrate to forms part of or all of the passive component. A metal carrier may form part of the substrate and part of the at least one passive component.

2 Claims, 12 Drawing Sheets

COMPOSITE RECONSTITUTED WAFER STRUCTURES

CROSS-REFERENCE TO RELATED APPLICATIONS

This application claims priority to GB 1217033.8 filed Sep. 25, 2012, the contents of which are incorporated herein by reference in its entirety.

TECHNICAL FIELD

This disclosure relates to reconstituted wafer structures and in particular to composite devices in reconstituted wafer structures.

BACKGROUND

Fan Out Wafer Level Packaging (FOWLP) is a wafer-level packaging technique which allows the production of devices comprising multiple dies and passive components. The technique provides a device with a reduced footprint and an increased area for solder ball connection points.

A FOWLP device can be formed by dicing a semiconductor wafer into individual die which are flipped onto an adhesive carrier (with the pad side facing the carrier) at a required spacing. The dies are then overmoulded with an epoxy material to form a reconstituted wafer which is a composite of the dies within the epoxy mold compound. The reconstituted wafer is removed from the carrier and polymer passivation and metal layers are then defined over the wafer. These define circuitry and provide connection points for mounting of the device to a PCB. The reconstituted wafer is then diced into individual devices which may be mounted in the conventional manner on PCBs.

The production technique allows multiple dies and passives to be integrated into a single device by placing the dies and passives in the required locations and dicing the reconstituted wafer as required.

The production technique also has a number of disadvantages. The epoxy material utilised to mould the wafer provides strength and stability to the device. Materials are selected to perform these functions rather than for their range of electrical properties which is limited, particularly at RF and microwave frequencies.

Passive components utilised in FOWLPs are typically conventional surface mount devices. The choice of device is limited by a restriction to Cu terminals, not solderable 0201 devices are the smallest that can be embedded, thereby limiting the minimum footprint, which is compounded by the size of the contact bands on such components. Only standard, common, values are available also limiting flexibility of design and RF performance.

There is a requirement for a FOWLP device incorporating passive components with improved performance and design freedom.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

There is provided a reconstituted electronic device, comprising a substrate in which at least one die and one piece of functional material are embedded, and at least one metallic redistribution layer on a surface of the substrate, the at least one metallic redistribution layer defining an electrical component in an area at least partially within the area of the functional material when viewed in a plan view.

The electrical component may be an interdigitated metal oxide metal capacitor.

The electrical component may be an inductor.

The electrical component may be an antenna.

The functional material may be a ceramic.

The functional material may be ferrite.

The functional material may surround the die.

There is also provided a reconstituted electronic device, comprising a substrate in which at least one die and one piece of functional material are embedded, the functional material comprising a ceramic body with a metal coating on a face of the body distal from a first surface of the substrate and a metal via through the body between the face of the body distal from the first surface and the face of the body proximal to the first surface and electrically connected to the metal coating, the metal coating defining a plate of a capacitor and the ceramic body defining a dielectric of that capacitor, and a metallic redistribution layer on the first surface of the substrate defining a second plate of the capacitor on the face of the body proximal to the first surface.

The device may further comprise a metallic redistribution layer on the first surface making contact with the via.

There is also provided a reconstituted electronic device, comprising a substrate having a first surface, comprising a metal carrier having an insulating coating on a face with at least one via electrically connected to the metal carrier through the insulating coating, at least one die positioned on the insulating coating and encapsulated within a moulding material deposited over the insulating coating, a surface of the die and at least one region of the insulating coating being exposed in first surface of the moulding material and forming the first surface of the substrate, and at least one metal redistribution layer on the first surface, wherein the metal carrier defines a first plate of a metal insulator metal capacitor, the coating defines a dielectric of that capacitor, and the metal redistribution layer defines a second plate of that capacitor.

The face of the coating may not be planar such that the exposed region of the insulating coating lies in the same plane as the exposed surface of the die.

The reconstituted electronic device may further comprise a metal redistribution layer electrically connected to the at least one via.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
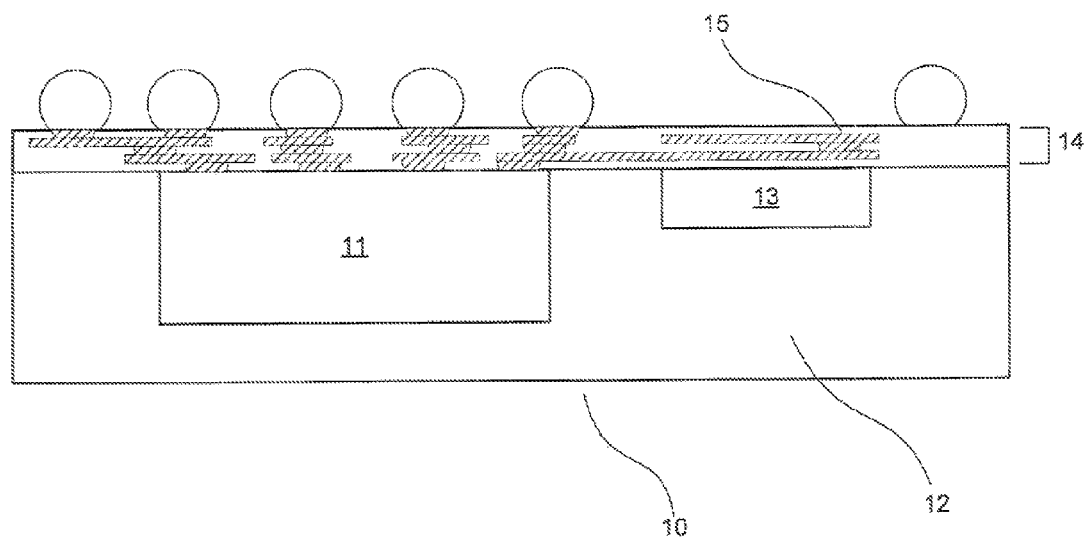
FIG. 1 shows a schematic cross-section of a Fan Out Wafer Level Package.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

FIG. 1 shows a cross-section of an embodiment of a FOWLP device 10. As in conventional devices a die 11 is embedded in the mould compound 12. However, in addition to the die 11 a piece of functional material 13 is also embedded in the mould compound 12. The functional material 13 may be any material with preferred electrical properties, as described in detail below. Polymer passivation and metal redistribution layers 14 are formed in the conventional manner over the die, functional material, and mould compound, but an electrical component 15 is defined by metal layers of the redistribution layers over the functional material 13.

Figure 2:
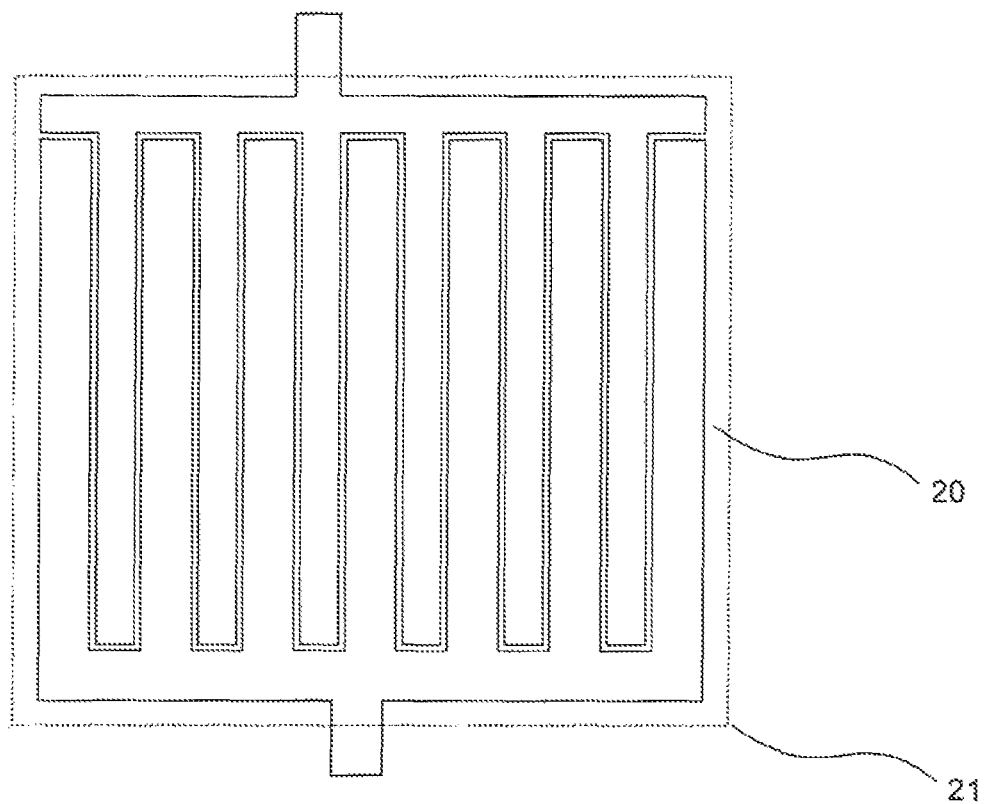
FIG. 2 shows a schematic diagram of an interdigital capacitor defined over a functional material.

In an embodiment the electrical component 15 is a capacitor. For example, an interdigitated Metal Oxide Metal (MOM) capacitor 20 may be defined, as shown in the plan-view of FIG. 2. The presence of the functional material 13 under the capacitor modifies the electrical characteristics of the capacitor giving increased design freedom. The functional material is selected according to its electrical, rather than mechanical, characteristics. For example, the functional material may be a nanoceramic material having a high permittivity to allow the formation of a high Q capacitor. For example, nanoceramic materials are available from Cambridge Nanotherm Limited (http://www.camnano.com) which may be appropriate for this application.

Figure 3:
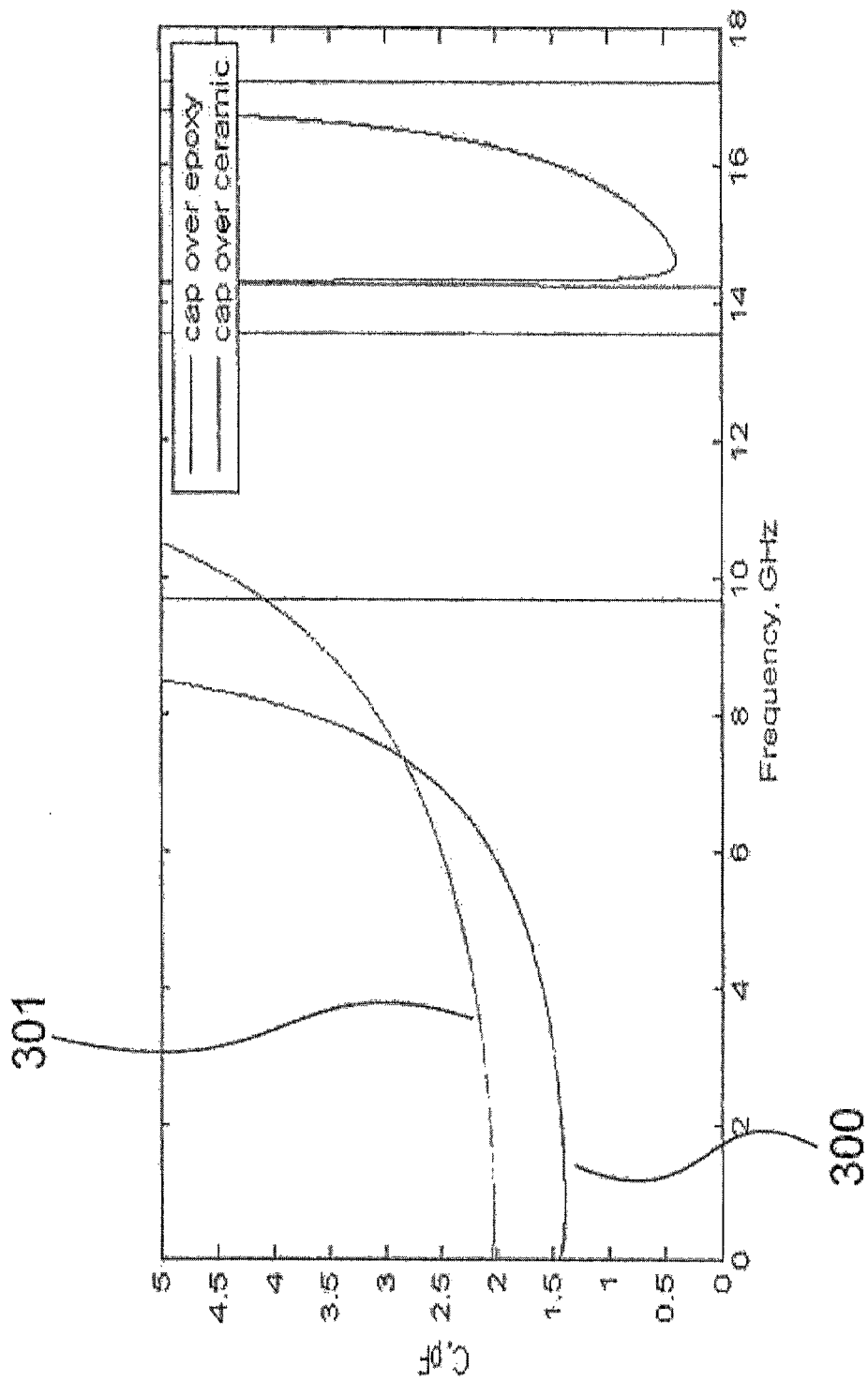
FIG. 3 shows a graph of capacitance against frequency for an exemplary capacitor with and without a functional material.
Figure 4:
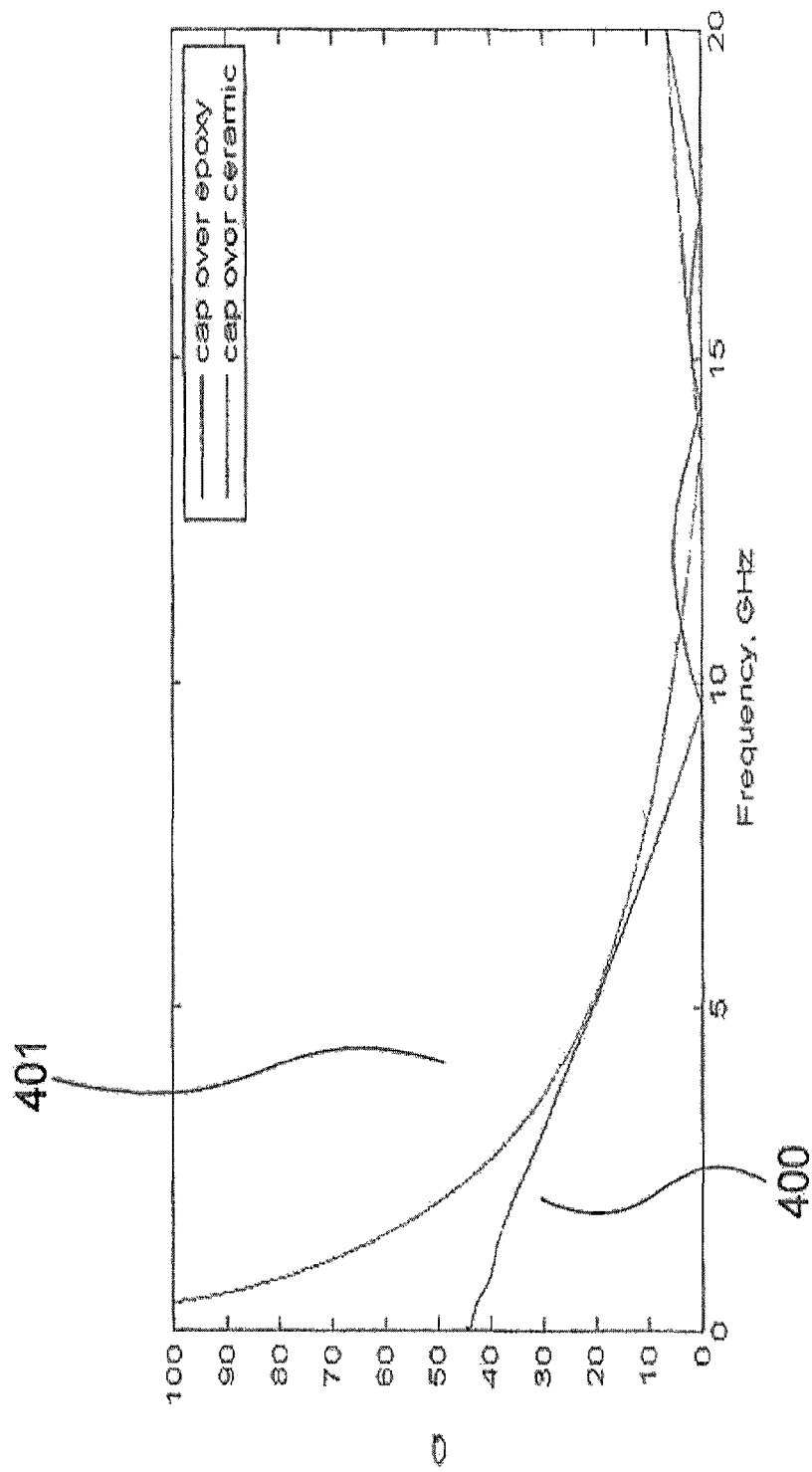
FIG. 4 shows a graph of Q-factor against frequency for an exemplary capacitor with and without a functional material.

FIG. 3 shows a graph of Capacitance (pF) against Frequency (GHz) for a MOM capacitor formed in a footprint of 610×540 µm. The line 300 is for the capacitor formed over conventional mould compound, and the line 301 is for the capacitor formed over a nanoceramic material. At 1 GHz the capacitance has been increased from 1.8 pF to 2.1 pF due to the introduction of the functional material. FIG. 4 shows a graph of Q factor against Frequency (GHz) for the capacitors described in relation to FIG. 3. Line 400 is for the capacitor formed over conventional mould compound and line 401 for the capacitor formed over a nanoceramic material. The Q factor has increased from 39 to 79 at 1 GHz due to the introduction of the functional material. The inclusion of a functional material thus allows a significant improvement in component performance.

Figure 5:
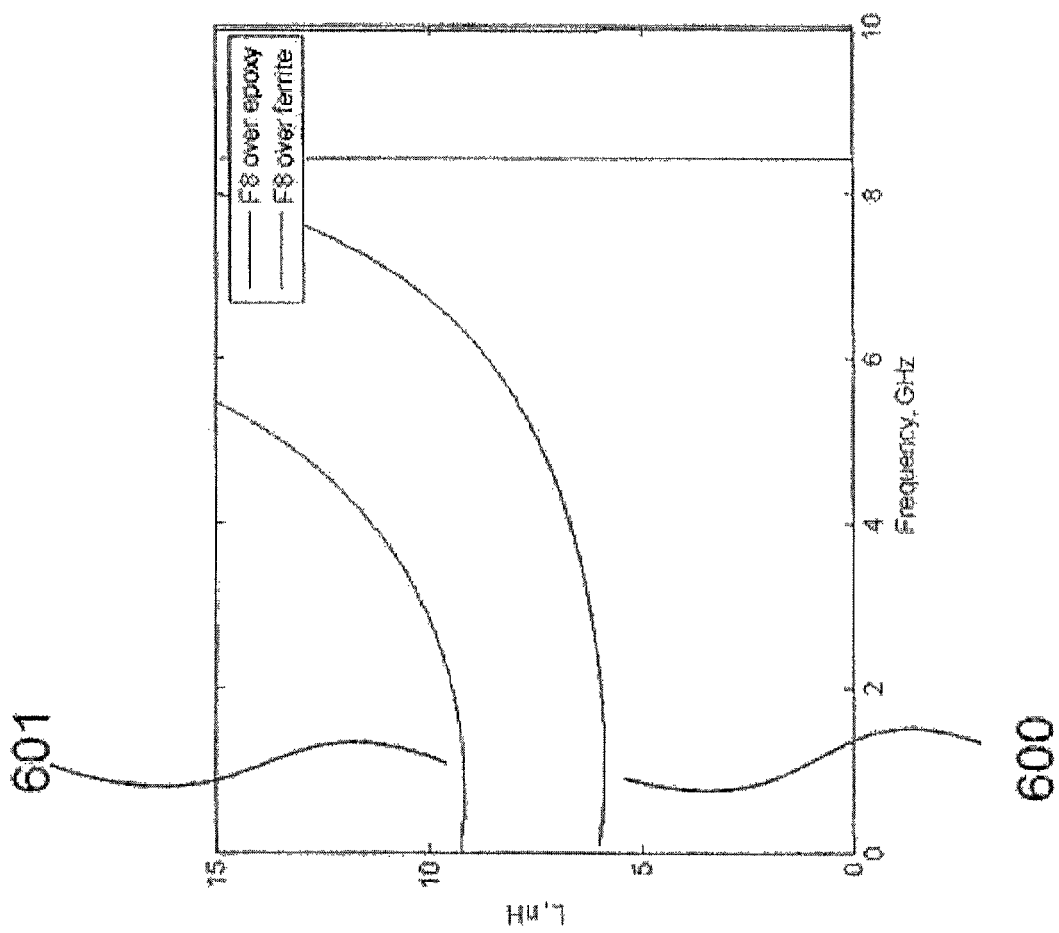
FIG. 5 shows a graph of inductance against frequency for an exemplary inductor with and without a functional material.
Figure 6:
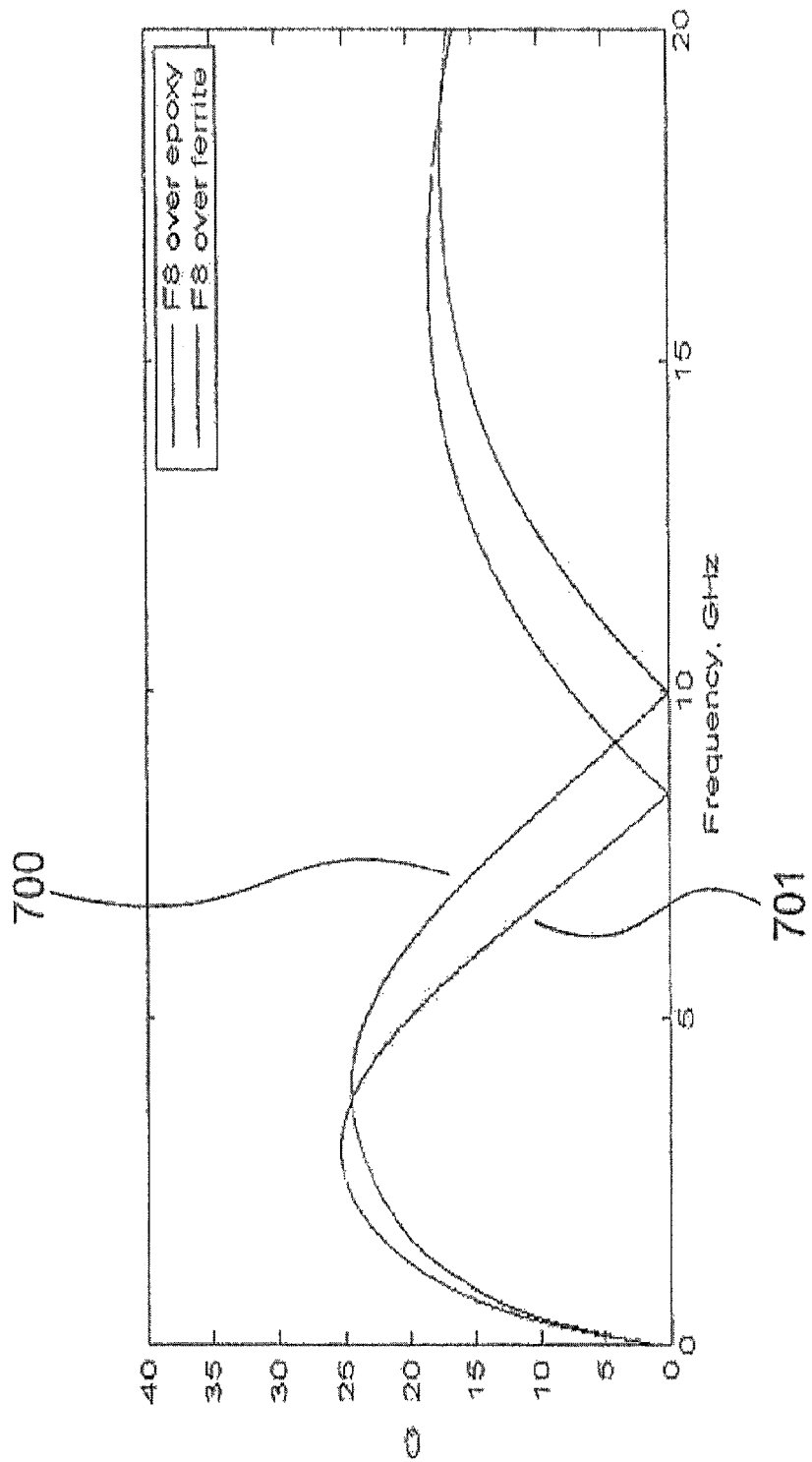
FIG. 6 shows a graph of Q-factor against frequency for an exemplary inductor with and without a functional material.

In a further embodiment the electrical component is an inductor formed in the metal redistribution layers. FIG. 5 shows a graph of inductance (nH) against frequency for an inductor formed in a footprint of 540×540 µm. The line 600 is for the inductor formed over conventional mould compound, and the line 601 is for the inductor formed over ferrite. At 1 GHz the inductance has increased from 6 nH to 9 nH. FIG. 6 shows a graph of Q factor against Frequency (GHz) for the inductor. Line 700 is for the inductor formed over convention mould compound and line 701 is for the inductor formed over ferrite. The Q factor has increased from 23 to 26 at 1 GHz with the general trend being an increase at lower frequencies.

Figure 7:
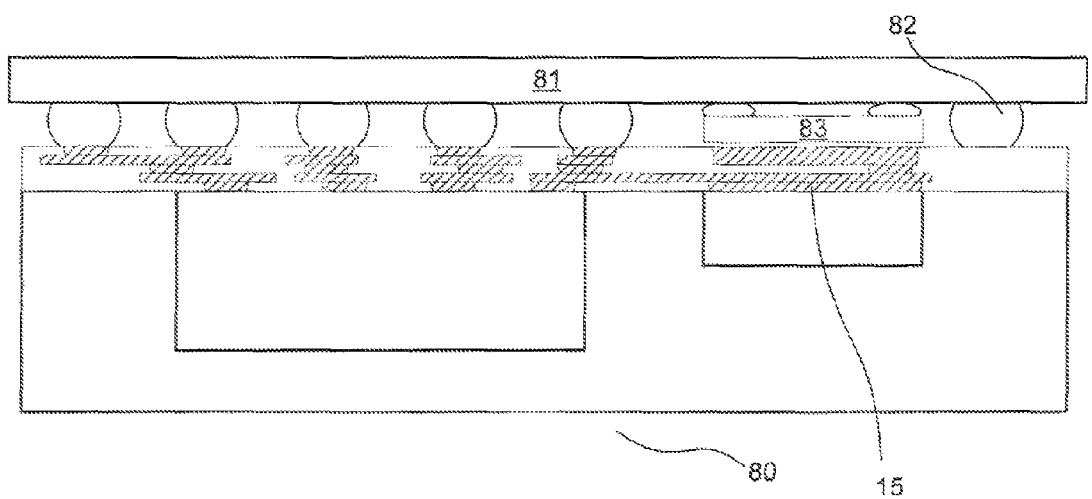
FIG. 7 shows a schematic cross-section of a Fan Out Wafer Level Package mounted on a PCB.

FIG. 7 shows a cross section of a FOWLP according to the foregoing description mounted on a PCB 81. The device is mounted in the conventional way using a plurality of solder balls 82 to make physical and electrical connections. A piece of functional material 83 is also mounted on the PCB 81 in a position to lie over the electrical component 15 defined in the redistribution layers to further modify the electrical characteristics of that component. This method allows the placement of a functional material proximal to both faces of the device, thereby giving further design freedom. The height of the functional material is designed to account for variations during solder reflow to ensure no stress is created due to contact with the FOWLP.

The embodiments described hereinbefore have been shown using a regular area of functional material in an area underneath the electrical component covering approximately the same area as the component. In various embodiments the functional material may cover the same area as the component, cover only part of the area of the component, or cover a large area than the component. As will be appreciated the terms 'over' and 'cover' are utilised to describe the spatial relationship of the electrical component and functional material when viewed in a plan view. The word 'cover' is not intended to suggest any physical contact or obfuscation of one part by another, but only that when represented in a plan view the areas of the parts are at least partially overlapping so that one area covers the other area to some degree.

Figure 8:
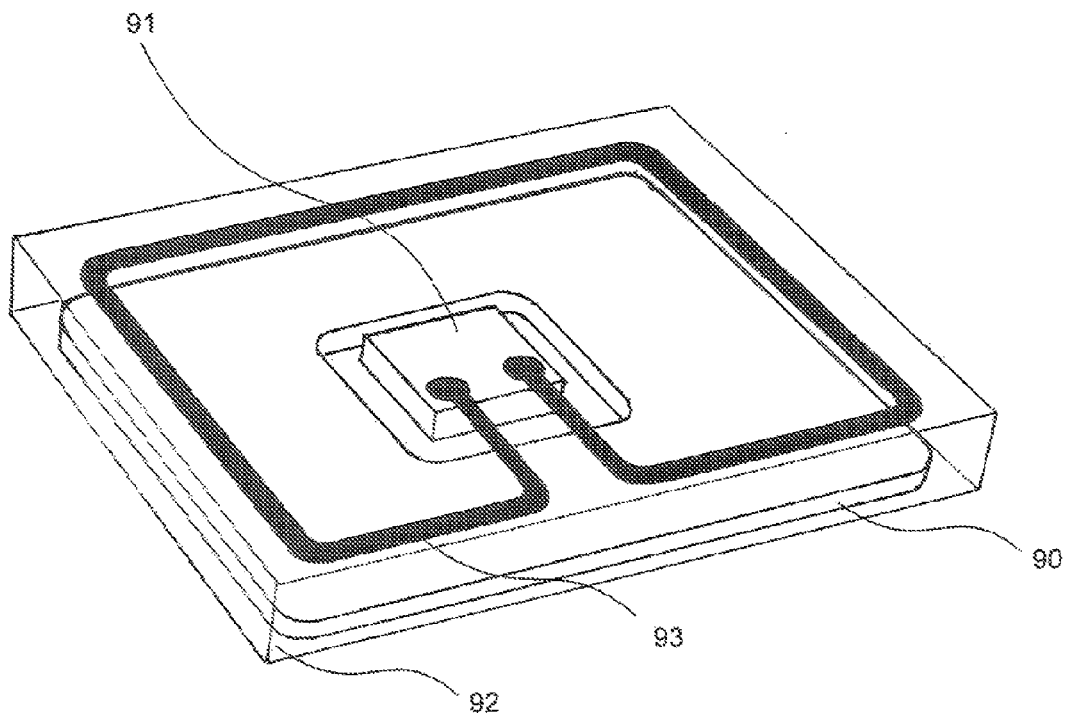
FIG. 8 shows a schematic diagram of an antenna formed over a functional material.

As will be apparent the shape and size of the functional material may be varied to accommodate different electrical devices, and multiple devices may be formed over each piece of functional material. Furthermore, the functional material may be shaped to suit particular components. In the embodiment of FIG. 8, a piece of ferrite 90 is shaped with a hole in the centre. The die 91 is positioned in that hole such that upon application of the moulding material 92 to form the reconstituted device, the die 91 is surrounded by the ferrite material 90. A component, such as an antenna 93, may be formed in the redistribution layers over the functional material 90. This arrangement allows the antenna to be designed in an optimised fashion, and enables efficient use of space.

Figure 9:
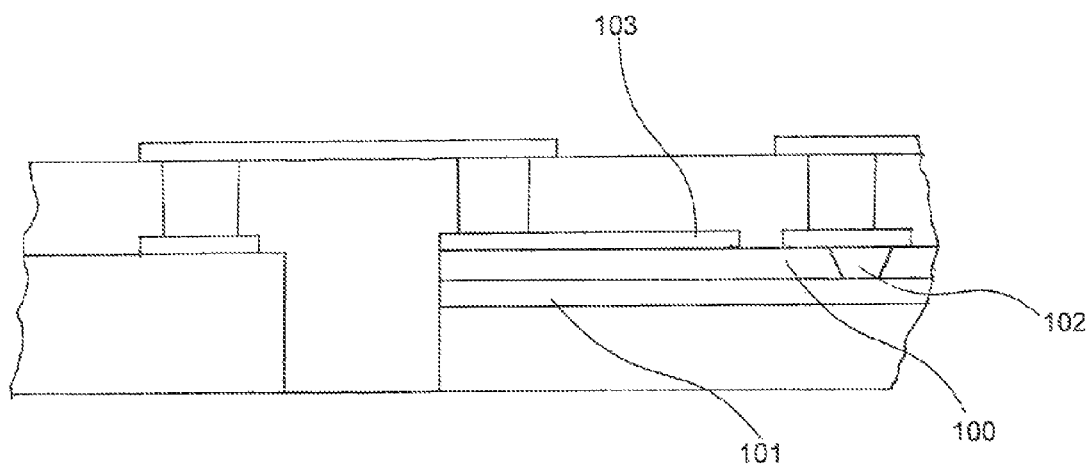
FIGS. 9 and 10 show schematic cross-sections of Fan Out Wafer Level Packages incorporating a capacitor.

The functional material may also be formed of more than one material to define part or all of an electrical component, as shown in the cross section of FIG. 9. In the device of FIG. 9 the functional material comprises a ceramic material 100, for example a nanoceramic, with a metal layer 101 on a bottom side to provide a first capacitor plate. As will be appreciated any dielectric material may be utilised in place of the ceramic material (for example Aluminum Oxide), depending on the required electrical properties. The metal layer 101 may be formed of any appropriate metal for the required component and processing technique, for example Aluminum. A via 102 through the ceramic 100 provides a contact to the bottom metal layer 101. A second capacitor plate 103 is provided by a metal redistribution layer. A redistribution layer is also laid out to make contact to the via. A parallel plate capacitor is thus formed and integrated within the FOWLP.

As will be appreciated, any configuration of vias and redistribution layers may be utilised to make contact to the capacitor plates. For example, the via may not pass through the ceramic piece, but may be created on the side surface of the piece.

Figure 10:
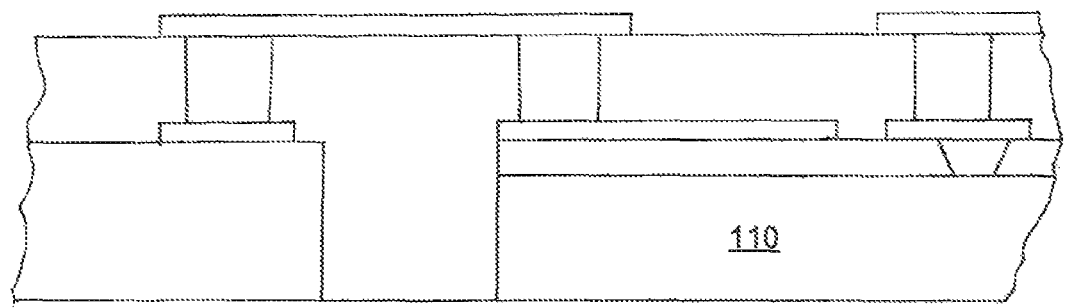

FIG. 10 shows an alternative embodiment of FIG. 10, in which the bottom metal layer 110 has a greater depth to provide improved thermal performance by acting as a heat sink. The depth of the metal part may be defined by the required performance. The metal part may continue through the substrate to expose the rear face, or the rear face may be within the substrate. For the avoidance of doubt, both such examples are considered to be 'embedded' within the substrate.

Figure 11:
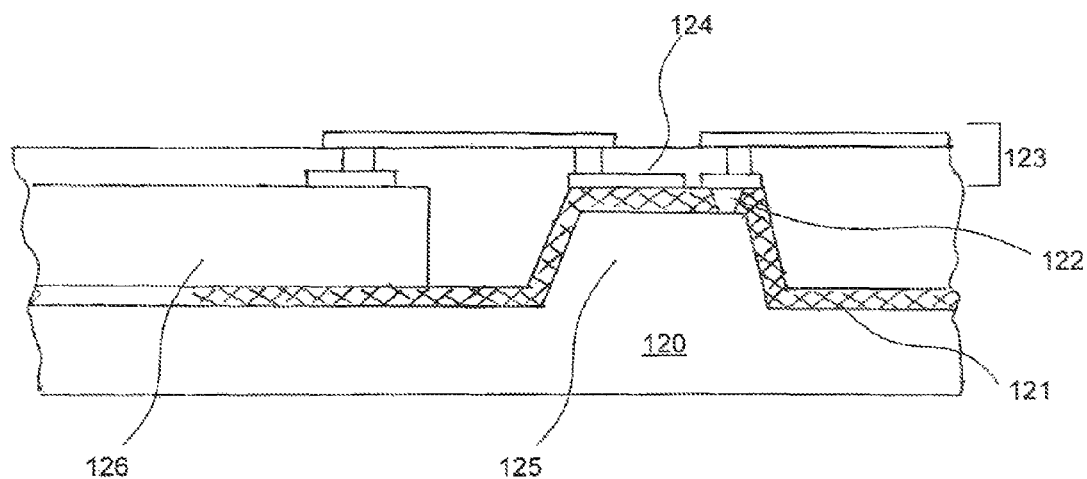
FIG. 11 shows schematic cross-section a Fan Out Wafer Level Package utilising a metal carrier.

FIG. 11 shows an embodiment of a FOWLP utilising a metal, for example Aluminum, carrier 120. The carrier is provided with an insulating coating 121 which electrically isolates the carrier from components positioned on the carrier. The coating 121 may be any appropriate material, for example a ceramic. Raised area 125 allows the formation of electrical components. The top of the coating in the region 125 is defined to fall at the same level as the top of at least one die 126 placed on the carrier. One or more vias 122 may be formed through the coating 121 to allow contact between redistribution layers 123 and the carrier 120. The die(s) for the device are placed on the carrier 120, and the die and surface of the carrier is encapsulated in a moulding compound 124 to form a reconstituted wafer. Redistribution layers are formed over the substrate using conventional techniques, prior to dicing into individual die. The reconstituted wafer is diced to produce individual reconstituted substrates.

A parallel plate metal insulator metal (MIM) capacitor may be formed between carrier 120 and a metal layer 124 of the redistribution layers, with the coating 121 forming the dielectric.

As will be appreciated any arrangement of levels of the carrier surface may be used in conjunction with appropriate processing sets to allow formation of the required components. For example, a carrier with multiple levels may be utilised to accommodate functional materials and dies having different thicknesses. Similarly, a planar carrier may be utilised with appropriate via techniques to make contact to the different levels which may result. For example, vias may be formed through the substrate material by laser cutting as known in the art for double sided FOWLP devices.

The metal carrier provides a heatsink for the die, and any other components of the device, as well as providing a ground plate for MIM capacitors. The ceramic layer is thin and doesn't significantly limit the thermal transfer to the carrier. However, the coating 121 electrically isolates the die and carrier. The carrier may also provide improved mechanical properties.

Figure 12:
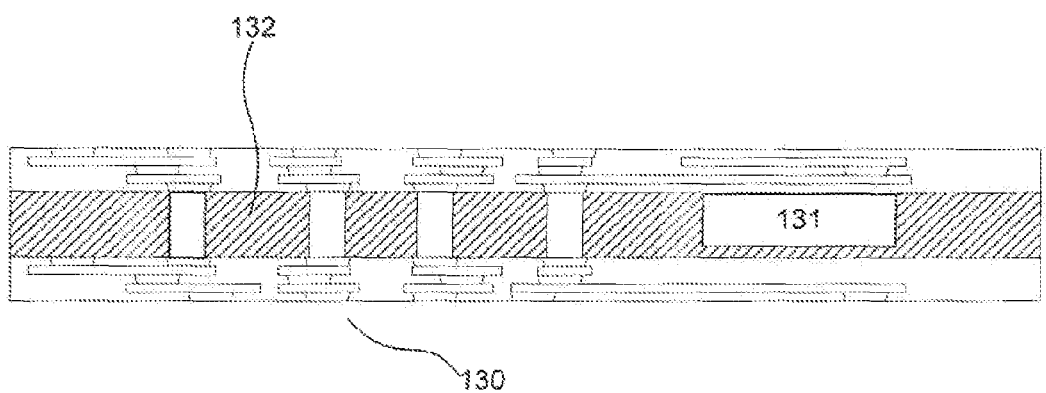
FIG. 12 shows a schematic cross-section of a PCB incorporating a functional material.

Comparable techniques to those described above may also be utilised to form PCBs. FIG. 12 shows a PCB 130 with a functional material 131 embedded in the core material 132. The techniques described above for the formation of components in the redistribution layers may be utilised to form components in the PCB build-up layers over the functional material. Electrical components are thereby formed in the PCB having improved characteristics and design freedom, as per the embodiments described hereinbefore.

As will be appreciated the processes and embodiments described hereinbefore may be implemented in a comparable way in PCBs as exhibited by FIG. 12 with appropriate modifications which will be apparent to the Skilled Person in light of the disclosure hereinbefore.

Where redistribution layers are described as being 'on' a surface of the substrate or device, this is not intended to require physical contact between a particular layer and the substrate or device. As will be appreciated, redistribution layers are separated from each other and the die/substrate by passivation layers. The word 'on' therefore requires the set of redistribution and passivation layers to be built up on the surface, but not a direct physical contact of all layers to that surface.

References herein to different layers of the redistribution layers connecting to difference points is not intended to imply that those layers are at different heights away from the surface of the substrate, but also to encompass different parts of one particular layer height.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A reconstituted electronic device, comprising
   a substrate in which at least one die and one piece of functional material are embedded, and
   at least one metallic redistribution layer on a surface of the substrate, the at least one metallic redistribution layer defining an electrical component in an area at least partially within the area of the functional material when viewed in a plan view,
   wherein the electrical component is an interdigitated metal oxide metal capacitor.

2. A reconstituted electronic device according to claim 1, wherein the functional material is a ceramic.

* * * * *

UNITED STATES PATENT AND TRADEMARK OFFICE
CERTIFICATE OF CORRECTION

| | | |
|---|---|---|
| PATENT NO. | : 8,791,543 B2 | |
| APPLICATION NO. | : 13/631855 | |
| DATED | : July 29, 2014 | |
| INVENTOR(S) | : Lenive et al. | |

It is certified that error appears in the above-identified patent and that said Letters Patent is hereby corrected as shown below:

In The Specification

In Column 1, Line 48, delete "solderable" and insert -- solderable finish. --, therefor.

Signed and Sealed this
Twenty-eighth Day of April, 2015

Michelle K. Lee
*Director of the United States Patent and Trademark Office*